United States Patent [19]

Humberstone

[11] Patent Number: 4,670,364

[45] Date of Patent: Jun. 2, 1987

[54] PHOTOMASK FOR ELECTROPHOTOGRAPHY

[75] Inventor: Victor C. Humberstone, Sawston, England

[73] Assignee: Comtech Research Unit Limited, London, England

[21] Appl. No.: 739,822

[22] Filed: May 31, 1985

Related U.S. Application Data

[62] Division of Ser. No. 495,450, May 17, 1983, Pat. No. 4,524,116.

[30] Foreign Application Priority Data

May 18, 1982 [GB] United Kingdom ................ 8214427

[51] Int. Cl.[4] ........................ G03F 9/00; G03C 3/00

[52] U.S. Cl. ...................................... 430/5; 430/14

[58] Field of Search ................................ 430/5, 14

[56] References Cited

U.S. PATENT DOCUMENTS 3,661,580 5/1972 Mayaud ........................ 430/5 X

FOREIGN PATENT DOCUMENTS 53-3070 1/1978 Japan ................................ 430/5

54-69072 6/1979 Japan ................................ 430/5

57-46243 3/1982 Japan ................................ 430/5

*Primary Examiner*—Roland E. Martin

*Attorney, Agent, or Firm*—Poms, Smith, Lande & Rose

[57] ABSTRACT

The invention provides a master for use in image transfer by contact printing onto a transparent electrophotographic (TEP) film, which comprises an electrically insulating substrate having a planar surface which carries image elements deposited thereon; and a thin transparent insulating layer covering said planar surface and said image elements. The surface of the thin transparent insulating material is preferably profiled so that it comprises a base level and raised portions extending above said base level, the area of the raised portions being small compared to the total surface area of the transparent insulating layer. A thin transparent electrode may be incorporated between the substrate and the thin transparent insulating layer.

Methods of forming such a master and of contact printing with it are also disclosed.

9 Claims, 3 Drawing Figures

PHOTOMASK FOR ELECTROPHOTOGRAPHY

This is a division of co-pending application Ser. No. 495,450 filed on May 17, 1983, now U.S. Pat. No. 4,524,116.

This invention relates to electrophotography and, more particularly, is concerned with contact printing onto transparent electrophotographic (TEP) films.

TEP films usually consist of a mechanical base material which is strong, transparent and dimensionally stable. Polyethylene terephthalate is commonly used. On one side of the base material there is a transparent electrode which may be a thin layer of tin oxide or an ultra thin film of a metal. A photoconductive material is deposited as a layer on top of this transparent electrode. The performance of the TEP film in terms of speed, resolution, transparency and other desirable properties depends critically on the composition and preparation of the photoconductive layer.

In use, a TEP film is given a uniform charge on the surface of its photoconductive layer in the dark. This is usually carried out by exposing the surface of the film to a corona discharge while the transparent electrode is earthed. With the electrode still (or again) earthed, the film is exposed imagewise. Those parts of the film exposed to light lose part of their surface charge and the electrical potential on those surface parts is substantially reduced. The resultant electrostatic image is then developed by the application of toner particles and the toner image is usually stablilised by fusing the particles.

In photographic techniques other than electrophotography, it is well known that, when reproduction of fine detail over a large area in a short exposure time is required, contact printing has great advantages. The phrase "contact printing" is often used to include what is more correctly called "near contact printing" in which the original or master and the print material are carefully held a small distance apart. Nevertheless, when the finest detail is required, it is advantageous to have master and print in contact or as nearly in contact as is practicable.

Attempts to achieve contact printing with TEP film give rise to problems. Firstly, a high definition master is generally likely to be formed of electrically conductive image elements deposited on an insulating substrate such as glass, in which case the electrostatic image formed on the surface of the TEP film is degraded by conduction. Even if the image elements of the master are electrically insulating, transfer of electrostatic charge can still occur. This results in a characteristic "waterdrop" pattern which destroys or degrades the desired image. An example of such a pattern is illustrated in FIG. 1 of the drawings accompanying this application.

The present invention is particular concerned with providing means and methods for achieving contact printing onto TEP film whereby the problems mentioned above can be obviated or ameliorated.

According to one aspect of the present invention, there is provided a master for use in image transfer by contact printing onto a transparent electrophotographic (TEP) film, which comprises an electrically insulating substrate having a planar surface which carries image elements deposited thereon; and a thin transparent insulating layer covering said planar surface and said image elements.

According to another aspect of the invention, there is provided a method of forming a master for use in image transfer by contact printing onto a TEP film, which comprises: (1) forming an image on a planar surface of an electrically insulating substrate; and (2) depositing a thin layer of an electrically insulating material over said planar surface and said image elements so as to form a thin transparent electrically insulating layer.

According to a third aspect of the invention, there is provided a method of contact printing onto a TEP film, which comprises (a) forming a uniform surface charge on the surface of the photoconductive layer of the TEP film; (b) bringing the charged surface of the TEP film into contact or into near contact with an image-bearing master as defined above; (c) exposing the charged surface of the TEP film through said master; and (d) removing the master and developing the TEP film.

Generally, the image elements in a master in accordance with this invention will be formed of regions of an electrically conductive material deposited on the insulating surface, e.g. on a glass surface. Chromium is particularly useful as the material from which the image elements are formed. Advantageously, a thin layer of an electrically conducting material is formed between the insulating substrate and the thin electrically insulating layer over at least those regions of the surface which do not carry image elements. When the image elements are formed of electrically conductive material, the thin electrically insulating material forms a thin transparent electrode which is in thermal contact with the image elements. Even more advantageously, the electrically conducting material can be deposited over the whole of the surface to form a thin, continuous, transparent electrode layer. With such an arrangement, the thin transparent electrode and the image elements are sandwiched between the transparent insulating layer and the substrate. Such a thin transparent electrode is beneficial because it provides a layer of uniform electrical potential which can improve the uniformity of the contact printing process. When the contact printing is carried out, this electrode can be charged to a potential which is intermediate those which will exist on the exposed and unexposed portions of the surface of the TEP film. The exact value adopted will depend upon the nature of the TEP film; proprietory materials such as Kodak SO-101 and SO-102 are charged to approximately 600 V prior to exposure, while JRG (James River Graphics) P5-003 is charged to a potential between 1000 and 1500 volts. By maintaining the thin transparent electrode of the master at an intermediate electrical potential, the potential difference between any part of the TEP film surface and the surface of the master is minimised. If it is intended to carry out the image transfer process by near contact printing, it may even be possible to dispense with the thin transparent electrically insulating layer, especially if the potential applied to the thin transparent electrode is such that the potential difference between the surface of the master and any part of the TEP film surface is reduced to a level below the Paschen threshold in air, so that even a minute (but non-zero) gap prevents any charge transfer.

Preferably, the surface of the transparent insulating layer of a master in accordance with the invention is treated so as to give a plurality of raised portions extending above the base level of the surface, the area of the raised portions being small compared to the total surface area of the transparent insulating layer. Where the insulating layer is formed from an electron beamsensitive resist or a photoresist material, the surface can be profiled to give the desired raised portions by controlled scanning of the electron or optical beam, or it may be produced as an interferogram, or a superposition of more than one interferogram, using multiple beam interferometry which can produce an interference pattern of either narrow light lines on a dark background or narrow dark lines on a bright background.

The purpose of the raised portions on the surface of the transparent insulating layer is to minimise charge sharing between the master and the TEP film when they are brought into contact for a contact printing operation. The raised portions are equivalent to surface roughness on a very small scale, and charge transfer cannot occur at points other than the peaks of the surface profile of the insulating layer. By careful control of the profile, the area of the asperities in contact with the TEP film may be made a very small fraction of the total area: a value as low as 0.1% can be achieved without undue difficulty. It is, however, essential that the scale of the surface profile be small compared with the smallest detail in the master which is to be reproduced.

An alternative method of producing a profiled surface on an insulating layer formed of a photo-resist material is by means of a sheet of vesicular diazo reprographic material. The sheet of material, which is as large as or larger than the master, is fully exposed and developed. As is well known, this produces a surface on the diazo material which resembles a close-packed array of blisters. The dimensions of these blisters are very small, typically 1 micrometer or less. By placing this blistered surface in contact or near contact with the smooth layer of photo-resist, and exposing the photoresist through the developed vesicular diazo material, subsequent development of the photo-resist gives a surface which is sufficiently well profiled to give good quality contact prints with TEP film.

Yet another method which may be used to produce a generally smooth flat surface of insulating layer with scattered asperities totalling only a small proportion of the total surface area is to form a thin film by any known technique using one of the known film-forming resins which has been lightly loaded with particles of an insulating filler. There should be not more than 0.1% by weight of filler particles, based on the weight of resin, and the particle size of the filler must be slightly larger than the final average thickness of the film. In this way, the filler particles themselves act as the raised portions or asperities in the final layer of insulating material.

Contact printing, as opposed to near contact printing, is preferred because the latter involves the practical difficulties of achieving extreme flatness and parallelism of the master and of the TEP film, whereas the former (which involves urging the master and the TEP film into contact) avoids these difficulties.

For a better understanding of the invention, and to show how the same may be carried into effect, reference will now be made, by way of example, to the accompanying drawings, in which.

Figure 1:
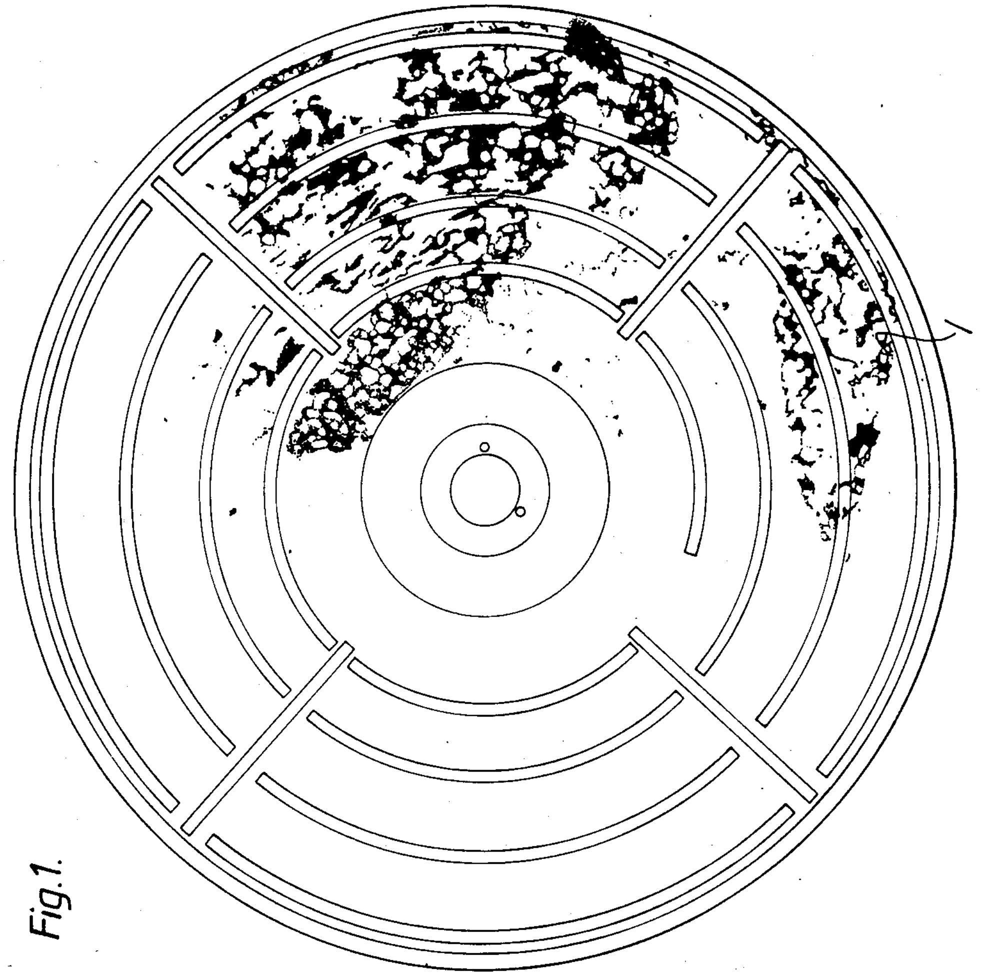
FIG. 1 illustrates the unsatisfactory results obtained if contact printing onto a TEP film is attempted by conventional methods.

Referring to FIG. 1, there is shown the result of exposing a TEP film in contact with a master carrying a grating image. The master consisted of a glass substrate carrying the image elements in the form of deposited chromium metal. A characteristic waterdrop pattern 1 renders such a print unusable.

Figure 2:
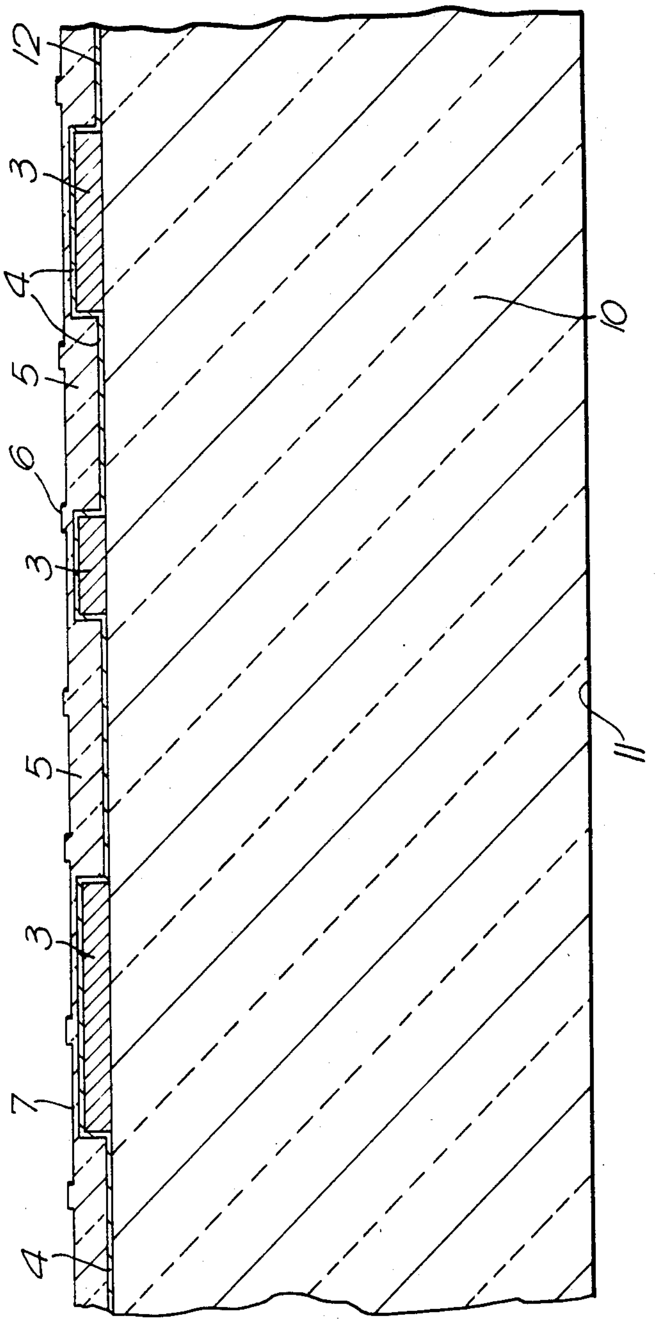
FIG. 2 is a partial cross-section through a preferred embodiments of a master in accordance with this invention.

Referring now to FIG. 2, there is shown a master in accordance with this invention which comprises a glass substrate 10 having a back surface 11 and a front surface 12, both surfaces being planar and parallel. The image on the master is formed by the presence or absence at any particular point of an opaque layer of chromium. Areas where chromium is present are indicated at 3. A transparent electrode 4 covers the entire top surface 12 of the substrate 10, including those areas which carry the image elements 3. The transparent electrode 4 can be in the form of chromium, the difference in thickness between image elements 3 and electrode 4 being sufficient to enable the former to be optically opaque while the latter is optically transparent. An overall layer of an optically transparent insulating material 5 covers all of the upper surface of the substrate. The upper surface of insulating layer 5 has a base level 7 which occupies the great majority of the surface area, together with a plurality of raised portions or asperities 6. In order to ensure that the base level 7 is at a uniform distance from the upper surface 12 of the glass substrate 10, the thickness of the insulating layer in regions over the image elements 3 is reduced in comparison with that over areas where image elements are absent. The insulating material 5 is a photo-resist and the asperities 6 were produced in a uniform array by a multiple beam interferometric technique. The purpose of the raised portions is to enable the contact printing method to be carried out with the master held against a TEP film while ensuring that the greater part 7 of the surface of the master is slightly spaced apart from the TEP film. This greatly limits the possibility of charge sharing between the TEP and the master, which can degrade the image to some extent.

The insulating layer 5 including its asperities 6 ideally has an apparent thickness which is small compared with the definition required in the image.

As indicated earlier, a modification of the invention consists in employing a thin transparent electrode layer (such as 4) without the thin transparent insulating layer 5. Such an embodiment may confer advantages where it is preferred to adopt a simpler manufacturing process for the master.

One area where the present invention is expected to be of value is in the storage of information in a compact state. It is well known that storage volume of information can greatly be reduced by keeping miniaturised copies of the originals. In such technology, one piece of record material may contain many pages of original documentation in reduced form. Examples of apparatus and techniques in this particular field are described and claimed in co-pending British Patent Application Nos. 8102096; 8118329; 8122736; and 8122737. The foregoing documents may be inspected in the file of European Patent Publications 0033240 and 0071377 and in the file of International patent publication WD 82/04489. It is often convenient to locate specific pages of information precisely by means of a two dimensional coordinate system. Cartesian or polar coordinates are most commonly used, but others may have advantages in specific applications. In many systems of record reading or writing machines, it is convenient for the coordinate system to be part of the record, rather than, or in addition to, being part of the machine. This is an outstanding example of the requirement for precise, high definition image forming over a large area, which thus calls for contact printing. In addition, the coordinate system is required to be imposed, as a series production operation, on a large number of TEP film blanks, which will subsequently be filled with different items of information. This production operation makes it worthwhile to produce a contact printing master through a relatively complex sequence of steps. Masters in accordance with the present invention are believed to be suitable for use in large scale series production operations such as envisaged above.

Figure 3:
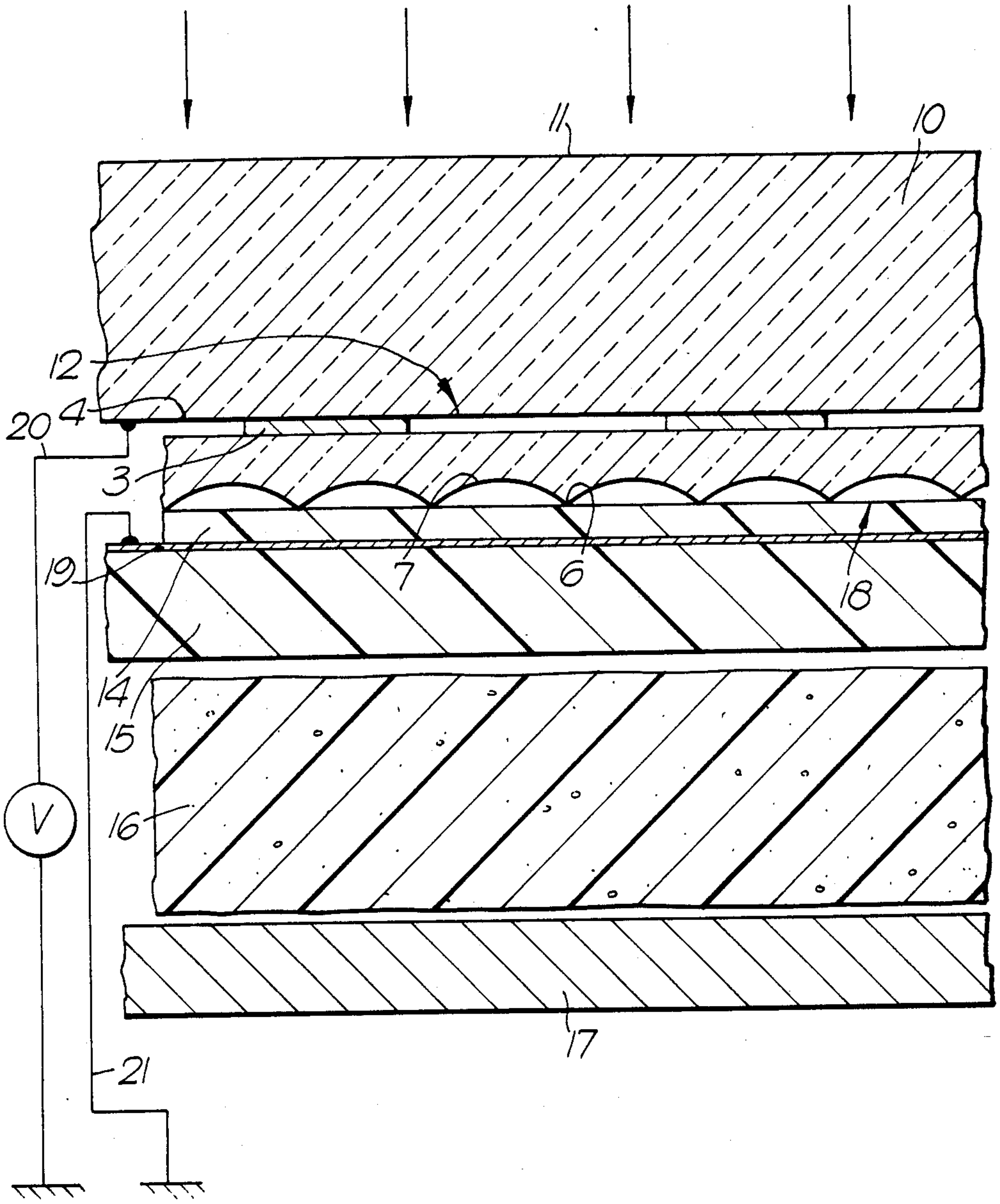
FIG. 3 is a greatly enlarged cross-sectional view through a master and a TEP film.

The invention will be further described with reference to FIG. 3 of the accompanying drawings, in which there is shown a cross-sectional view (greatly enlarged and not to scale) through a master and a TEP film. The master is generally in the form of that shown in FIG. 2, and corresponding reference numerals are used to denote the same parts of the master. It should be noted, however, that in this embodiment, the insulating layer 5 is a photoresist produced by the vesicular diazo method described hereinbefore. The TEP film comprises a photoconductor layer 14 whose surface 18 is electrically charged and is to be exposed imagewise; a substrate layer 15; and, between layers 14 and 15, a transparent electrode layer 19. This layer is earthed via lead 21.

The transparent electrode layer 4 of the master 10 is connected via lead 20 to a voltage source V; the other side of the voltage source V is earthed as shown.

The TEP film is held between the master and an open-cell foam pad 16 which is mounted onto a rigid base plate 17. The foam 16 is sculpted into a rounded shape so that as the master is clamped against the TEP film, no significant amounts of air are entrapped between the TEP film and the master, which could degrade the quality of the image produced in the TEP film.

The master is held at an appropriate surface potential by voltage source V, and the conducting layer 19 of the TEP is earthed via a conducting tag as already explained. This connection is usually effected remote from the imagewise exposure station, but the connection is shown in the present drawing for completeness.

Imagewise exposure of the TEP film is then made through the chromium-on-glass master. The insulating layer 5 with its asperities 6 prevents or at least greatly limits charge sharing between the master and the TEP film.

After exposure, the TEP film is removed from the exposure station and is subjected to conventional processing to give a copy of the master. With the arrangement as shown in FIG. 3, it is possible to obtain exact copies of the master with no significant degradation of the image.

I claim:

1. A master for use in image transfer by contact printing onto a transparent electrophotographic (TEP) film, which comprises an electrically insulating substrate having a planar surface which carries image elements deposited thereon; a thin transparent insulating layer covering said planar surface and said image elements; and wherein said master includes a thin transparent electrode deposited between said planar surface and said thin transparent insulatng layer at least over those regions of the surface which do not carry image elements.

2. A master as claimed in claim 1, wherein the image elements are in the form of regions of an electrically conductive material, and wherein said thin transparent electrode is in contact with said image elements.

3. A master as claimed in claim 1 wherein said thin transparent electrode is a continuous layer which coats the image elements and those regions of said surface which do not carry image elements.

4. A master as claimed in claim 1 wherein the surface of said transparent insulating layer is profiled so that it comprises a base level and raised portions extending above said base level, the area of the raised portions being small compared to the total surface area of the transparent insulating layer.

5. A master for use in image transfer by contact printing onto a transparent electrophotographic (TEP) film, which comprises:

(1) an electrically insulating substrate having a planar surface on which there are deposited image elements in the form of regions of an electrically conductive material;

(2) a thin transparent electrode layer deposited on said surface at least over those regions thereof which do not carry image elements; and (3) a thin transparent insulating layer covering said thin transparent electrode and said image elements.

6. A master as claimed in claim 5, wherein said thin transparent electrode is a continuous layer which coats the image elements and those regions of said surface which do not carry image elements.

7. A master as claimed in claim 5, wherein the surface of said transparent insulating layer is profiled so that it comprises a base level and raised portions extending above said base level, the area of the raised portions being small compared to the total surface area of the transparent insulating layer.

8. A master for use in image transfer by contact printing onto a transparent electrographic (TEP) film, which comprises:

(1) an electrically insulating substrate having a planar surface on which there are deposited image elements in the form of regions of an electrically conductive material;

(2) a thin transparent continuous electrode layer deposited over said image elements and over those regions of said surface which do not carry image elements; and (3) a thin transparent continuous insulating layer overlying said thin transparent continuous electrode layer, that surface of said thin transparent continuous insulating layer remote from said thin transparent continuous electrode layer being profiled so that it comprises a base level and raised portions extending above said base level, the area of the raised portions being small compared to the total surface area of the transparent insulating layer.

9. A master as claimed in claim 8, wherein the electrically conductive material constituting said image elements and said thin transparent continuous electrode layer are formed of the same material, said image elements being optically opaque by virtue of their thickness compared with that of said thin transparent electrode layer.

* * * * *